United States Patent [19]

Blossfeld

[11] Patent Number: 4,786,610
[45] Date of Patent: Nov. 22, 1988

[54] METHOD OF MAKING A MONOLITHIC INTEGRATED CIRCUIT COMPRISING AT LEAST ONE BIPOLAR PLANAR TRANSISTOR

[76] Inventor: Lothar Blossfeld, Freiburg, Fed. Rep. of Germany

[21] Appl. No.: 130,044

[22] Filed: Dec. 7, 1987

[30] Foreign Application Priority Data

Dec. 12, 1986 [EP] European Pat. Off. ........ 86117352.4

[51] Int. Cl.⁴ .................... H01L 21/302; H01L 21/265
[52] U.S. Cl. ........................................ 437/31; 357/34;
357/91; 437/34; 437/39; 437/203
[58] Field of Search ..................... 437/31, 34, 39, 175,
437/203; 357/34, 91

[56] References Cited

U.S. PATENT DOCUMENTS

| | | | |
|---|---|---|---|
| 4,640,721 | 2/1987 | Uehara et al. | 437/31 |
| 4,641,416 | 2/1987 | Iranmanesh et al. | 437/31 |
| 4,721,685 | 1/1988 | Lindenfelser et al. | 437/31 |
| 4,729,965 | 3/1988 | Tamaki et al. | 437/31 |
| 4,731,341 | 3/1988 | Kawakatsu | 437/31 |

FOREIGN PATENT DOCUMENTS

| | | |
|---|---|---|
| 0040032 | 11/1981 | European Pat. Off. . |
| 0071665 | 2/1983 | European Pat. Off. . |
| 0139266 | 10/1983 | European Pat. Off. . |
| 0093786 | 11/1983 | European Pat. Off. . |
| 0122313 | 10/1984 | European Pat. Off. . |
| 0239652 | 10/1987 | European Pat. Off. . |
| 3129539 | 6/1982 | Fed. Rep. of Germany . |
| 3243059 | 5/1984 | Fed. Rep. of Germany . |

Primary Examiner—Upendra Roy

[57] ABSTRACT

In this method, said emitter area (6) and said collector area of a bipolar transistor are each covered with a portion (71, 72) of an oxidation mask layer in a conventional manner. After implantation of ions of said conductivity type of said base region, an oxide stripe (21) surrounding said emitter are (6) is formed by thermal oxidation. After removal of said portions (71, 72) of said oxidation mask layer, successive layers (9, 10) are deposited which consist at least of a top layer (10) and an underlying doped silicide layer (9). Using a masked anisotropic etching process through said oxide stripe (21), said successive layers (9, 10) are divided into said emitter electrode (61) and said collector electrode (32), out of which said emitter region (4) and said collector contact region (31) are diffused.

8 Claims, 4 Drawing Sheets

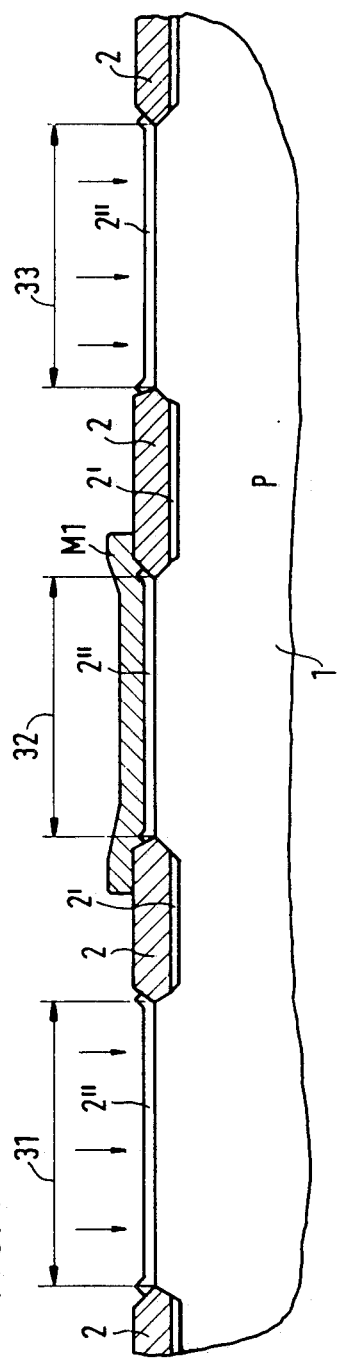
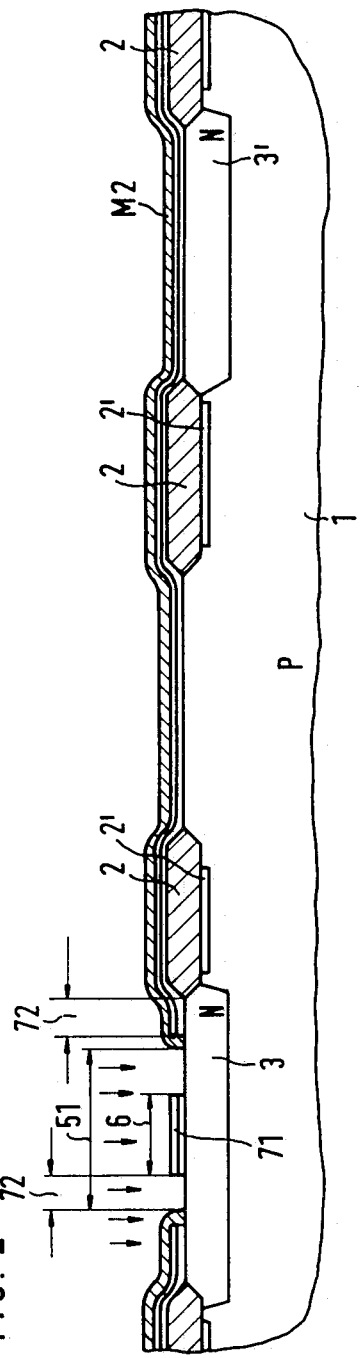
FIG. 1 (PRIOR ART)
FIG. 2 (PRIOR ART)

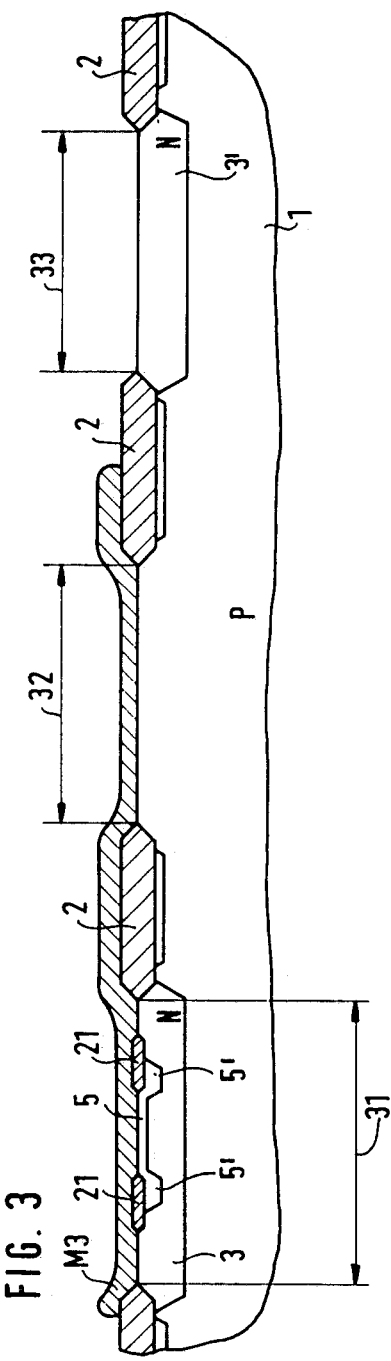
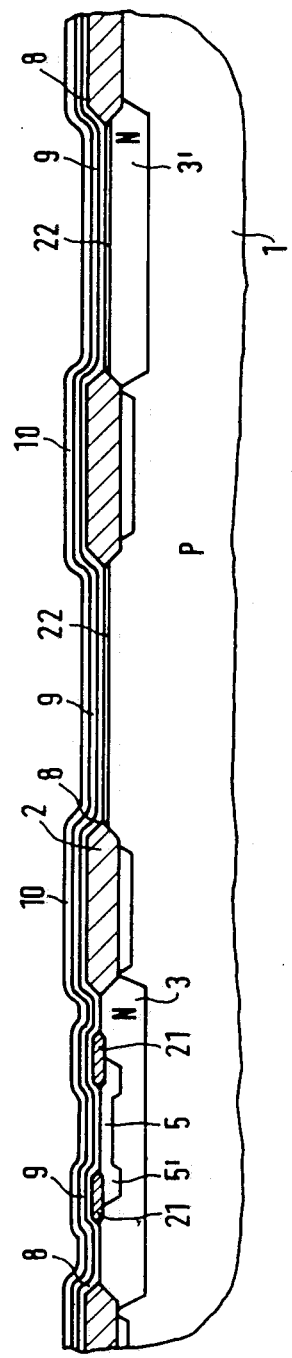

METHOD OF MAKING A MONOLITHIC INTEGRATED CIRCUIT COMPRISING AT LEAST ONE BIPOLAR PLANAR TRANSISTOR

BACKGROUND OF THE INVENTION

1. Field of the Invention

The present invention deals with a method suitable for making microwave monolithic integrated circuits which each include at least one integrated bipolar planar transistor, i.e., may also contain further integrated components, such as insulated-gate field-effect transistors, integrated capacitors or integrated resistors.

2. Description of the Prior Art

For a better understanding and to simplify the description, however, the method in accordance with the invention and the discussion of the prior art will be illustrated in connection with a method of making a monolithic integrated circuit comprising at least one bipolar planar transistor. Accordingly, the illustrated embodiment is not to be read as as limitation, especially since it well known to fabricate monolithic integrated circuits on a common semiconductor wafer, to separate the individual circuit chips, and to finally package them singly.

A method of this type is described in the published West German applications DE-A 32 43 059 and DE-A 31 29 539. There doped polycrystalline silicon layers are used to form the base contact region, with its base electrode, and to form the emitter region, with its emitter electrode, in close proximity to each other in a self-aligned structure. With that method, a very low base lead resistance and a relatively high operating speed are achieved. In addition, such a self-aligned process has the advantage of permitting clearances during the photolithographic processes to be minimized, so that the lateral dimensions of the bipolar planar transistors are reduced.

A disadvantage of the method disclosed in the above-mentioned DE-A 31 29 539 lies in the fact that a complicated epitaxial process is used, which keeps the yield small. The method disclosed in the above-mentioned DE-A 32 43 059 suffers from the drawback that the overlap capacitance between the emitter electrode and the base electrode limits the operating speed.

The invention starts from the method disclosed in EP-A-71 665, which essentially overcomes the above disadvantages, and takes up the idea of DE-A 31 29 539 to provide the bulk resistors of the polycrystalline silicon electrodes, which pass into interconnecting paths, with superficial silicide layers in order to reduce the lead resistances. This, too, results in an increase in the operating speed of the monolithic integrated circuit.

While the above-mentioned West German published applications do not deal with the formation of the collector electrode, in one embodiment of the method disclosed in EP-A-71 665, the collector contact region, the emitter region and the base contact region are formed using self-aligning technology, but this does not apply to the formation of contacts to various regions.

In the method disclosed in the above-mentioned EP-A-71 665 for making a monolithic integrated circuit comprising at least one bipolar planar transistor, the collector region of the latter, which lies at a main surface of a wafer-shaped semiconductor substrate, forms a collector area at said surface side within the opening of a field-oxide layer. To form the emitter region, the base region, and the collector contact region using using self-aligning technology, the emitter area is covered with a portion of an oxidation mask layer of such a thickness that this layer is penetrated by dopants of the base region in an ion-implantation process of relatively high energy, and masked against dopants of the base region in another ion-implantation process of relatively low energy.

After the ion-implantation processes, in which an implantation mask defines the base area, the exposed semiconductor surface is thermally oxidized, forming an oxide stripe which surrounds the emitter area. Then, the portion of the oxidation mask layer is removed. Finally, the main surface is covered with an oxide layer which has contact openings to the regions to which contact is to be made by means of electrodes. As is usual with planar integrated circuits, contact is made to the regions via conducting paths which are disposed on thermally produced oxide layers and/or on a deposited oxide layer. The conducting paths contact the regions or electrodes deposited thereon through contact openings in these insulating layers.

To form the contact openings in the insulating layers, a special photolithographic etching process with a given lateral clearance from the regions to be contacted is necessary to exclude any shorting of a pn junction at the semiconductor surface.

Accordingly, the problem to be solved by the present invention is to provide a method which is compatible with the method disclosed in the above-mentioned EP-A-71 665 and permits all regions of the planar transistor to be formed so that self-alignment with their contact regions or electrodes is achieved.

BRIEF SUMMARY OF THE INVENTION

The solution to the problem lies within the scope of the solution to the general problem of how to increase the operating speed. The method of the present invention provides a contribution to the solution of this general problem in that low-resistance contact can be made to the base region in the immediate vicinity of the emitter region without the need for a clearance.

The method of the invention thus has the additional advantage that only one uniformly doped polycrystalline Si layer is deposited which can be etched to define both the emitter electrode and the collector electrode, including the adjacent conductive paths.

This advantage is offered neither by the methods disclosed in the above-mentioned DE-A-31 29 539 and DE-A-32 43 059 nor by the method disclosed in the prior EP Application 86 10 3946.9 (ITT case L. Blossfeld 22, U.S. Ser. No. 028,472 of Mar. 20, 1987). However, in the method that prior proposal, two polycrystalline layers are deposited one after the other.

In a first embodiment of the method of the invention, a polycrystalline silicon layer is deposited which contains dopants of the conductivity type of the emitter region, whose conductivity type is equal to that of the collector region. After the electrodes have been formed by etching, the emitter region adjacent to the emitter electrode is diffused out of the emitter electrode; correspondingly, an adjacent collector contact region is diffused out of the collector electrode.

By contrast, in an alternative, second embodiment of the method according to the invention, prior to the deposition of the successive layers which are etched to define the emitter electrode and the collector electrode, ions of the conductivity type of the emitter region are implanted into the exposed portions of the collector area and the emitter area, which exposed portions adjoin the emitter electrode and the collector electrode, respectively.

The method of the invention, like the method disclosed in EP-A 71 665, which is compatible therewith, can be readily improved in such a way that both at least one P-channel insulated-gate field-effect transistor and at least one N-channel insulated-gate field-effect transistor of a CMOS circuit can be included in the integrated circuit.

The method of the invention preferably involves the formation of interconnection patterns which contain the emitter electrodes and/or the collector electrodes. This permits a further increase in operating speed because the bulk resistance of the interconnections is greatly reduced from the bulk resistance of interconnections formed soley from doped polycrystalline silicone.

The invention is an improvement in a method of making a monolithic integrated circuit. The circuit comprises at least one bipolar planar transistor whose collector region, which lies at a main surface of wafer-shaped semiconductor substrate, forms a collector area at the exposed surface within an opening of a field-oxide layer, wherein, to form the emitter region and the base region, the emitter area is covered with a portion of an oxidation mask layer of such a thickness that said oxidation mask layer is penetrated by dopants of the base region in a high-energy ion-implantation process and masked against dopants of the base region in a low-energy ion-implantation process. After the ion-implantation processes, which are carried out using an implantation mask defining the base area, the exposed semiconductor surface is thermally oxidized to form an oxide stripe surrounding the emitter area, whereafter the portion of the oxidation mask layer is removed. The improvement comprises the steps of providing the main surface of the semiconductor substrate with successive layers of at least an insulating top layer and an underlying silicide layer after removal of the portion of the oxidation mask layer covering the emitter area. The oxide stripe is then divided into an inner portion and an outer portion using an anisotropic etching technique, thereby forming a moat through the sucessive layers, which comprise the top layer, the silicide layer, and possibly a polycrystalline Si layer. That portion of the PN junction between the outer base-region portion and the collector region which extends to the semiconductor surface is exposed, whereby in addition to the emitter electrode, the collector electrode is defined, which overlaps the field-oxide layer. Ions of the conductivity type of the base region are then implanted, with the successive layers acting as a mask. An insulating layer is then deposited which covers the surface of the moat and the remaining portions of the top layer. Anisotropic etching is then performed in a gas phase, so that the rims of the moat, the rim of the emitter electrode, and the rim of the collector electrode remain covered by remainders of the insulating layer. Finally, after activation and diffusion of the implanted ions of the conductivity type of the base region, a contact layer for contacting the resulting base contact region is deposited from which the base electrode is formed using a photolithographic etching process.

In one particular embodiment a polycrystalline silicon layer containing dopants of the conductivity type of the emitter region is deposited, and after the polycrystalline silicon layer has been etched to define the emitter electrode and the collector electrode, the emitter region is diffused out of the emitter electrode, and at least one collector contact region is diffused out of the collector electrode.

In another embodiment, prior to the deposition of the successive layers, ions of the conductivity type of the emitter region are implanted into the exposed portions of the collector area and the emitter area.

The method according to the invention and its advantages will now be explained with reference to the accompanying drawings, in which like elements are referenced by like numerals.

BRIEF DESCRIPTION OF THE DRAWINGS

FIG. 1 is partial sectional views of a monolithic integrated circuit containing a bipolar transistor and a CMOS circuit which serves to explain successive operations in the known prior art.

FIG. 2 is the cross-sectional view of FIG. 1 after formation of a collector region in the bipolar transistor and a substrate region in the CMOS circuit according to the prior art.

FIG. 3 is the cross-sectional view of FIGS. 1 and 2 after formation of a base region in the bipolar transistor according to prior art.

FIG. 4 illustrates the first process step of the method according to the invention.

Figure 5:
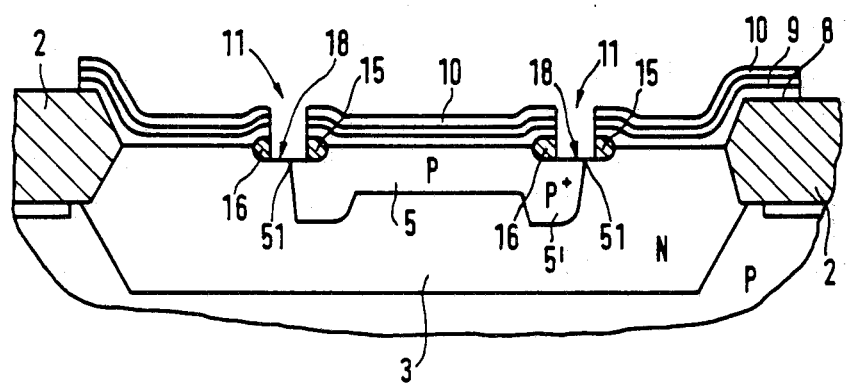
FIG. 5 is a cross-sectional view of only the bipolar transistor of the substrate of FIG. 4 shown in enlarged scale after formation of a moat to expose the base-collector junction prior to formation of base contacts.

The invention is better understood by considering the illustrated embodiment in the drawings as described in detail below.

DETAILED DESCRIPTION OF THE PREFERRED EMBODIMENTS

In the method of the invention, the emitter area 6 and the collector area of a bipolar transistor are each covered with a portion 71, 72 of an oxidation mask layer in a conventional manner. After implantation of ions of the conductivity type of the base region, an oxide stripe 21 surrounding the emitter are 6 is formed by thermal oxidation. After removal of the portions 71, 72 of the oxidation mask layer, successive layers 9, 10 are deposited which consist of a top layer 10 and an underlying doped silicide layer 9. Using a masked anisotropic etching process through the oxide stripe 21, the successive layers 9, 10 are divided into the emitter electrode 61 and the collector electrode 32', out of which the emitter region 4 and the collector contact region 31' are diffused.

FIGS. 1 to 4 of the accompanying drawings illustrate the improvement according to the invention with regard to the compatible method of the above-mentioned EP-A-71 665. According to the improvement, a monolithic integrated circuit can be fabricated which contains not only a planar transistor but also an insulated-gate field-effect transistor, the two transistors being formed simultaneously at a main surface of the semiconductor substrate. In the same manner, further bipolar planar transistors and further insulated-gate field-effect transistors may, of course, be formed in the same semiconductor substrate. The drawings are oblique sectional views with the scale greatly enlarged in the direction of the depth of the semiconductor substrate.

In FIGS. 1 to 4, the bipolar planar transistor is located in the substrate area 31, the N-channel insulated-gate field-effect transistor in the substrate area 32, and the P-channel insulated-gate field-effect transistor in the substrate area 33, as illustrated in FIG. 1. The substrate areas coincide with openings within the field-oxide layer 2. A P+-type channel-interrupting region 2' is disposed on the side of the field-oxide layer 2 facing the substrate. The field-oxide layer 2 is formed from the oxidation mask layers 2", e.g., a silicon-dioxide-silicon-nitride layer sequence, by patterning the oxidation mask layer, performing an ion implantation to introduce the dopants of the channel-interrupting region 2', and then performing a thermal oxidation.

Substitutionally for all areas of the N-channel field-effect transistors of the solid-state integrated circuit, the area 32 of the N-channel field-effect transistor is then masked by means of an implantation mask M1 of photoresist. By an ion implantation process as indicated by the arrows of FIG. 1, n-type impurities of the collector region of the bipolar planar transistor and of the substrate region of the P-channel insulated-gate field-effect transistor are introduced through the relatively thin oxidation mask layer portions 2" of the areas 31 and 33 into the substrate surface, the masking function being performed by the relatively thick field-oxide layer 2 and the implantation mask M1.

After careful removal of the implantation mask M1 and activation of the implanted ions in a high-temperature process in which the dopants penetrate further into the semiconductor body, the collector region 3 of the bipolar transistor and the substrate region 3' are formed, as shown in FIG. 2.

Then, as shown in FIG. 2, the emitter area 6 of the bipolar planar transistor is covered with a portion 71 of an oxidation mask layer by removing the implantation mask M1 from the surface of the structure of FIG. 1 and coating the exposed surface with an oxidation mask layer which is etched using a photolithographic process to form the portion 71. It is advantageous to form the oxidation mask layer or the portion 71 thereof as a combination of a lower silicon-dioxide layer and an upper silicon-nitride layer, as is indicated in FIG. 2. Preferably, an oxidation mask layer portion 72 covering the collector contact region is left at the edge of the collector region 3. This has the benefit, as will be demonstrated, that the emitter electrode and the emitter region can be fabricated simultaneously with the collector electrode and the collector contact region using self-aligning technology.

The main surface of the structure, which contains the collector region 3 and the substrate region 3', is then covered with photoresist from which the implantation ask M2 is formed photolithographically, which leaves the base area 51, including the emitter area 6, uncovered, as illustrated in FIG. 2.

The thickness of the oxidation mask layer, and, thus, the thickness of the portion 71 of this layer are so chosen that in a high-energy ion-implantation process for introducing dopants into the base region, portion 71 will be penetrated by these dopants, while in another, low-energy ion-implantation process for introducing dopants into the base region, it will act as a mask against these dopants. After such a two step ion-implantation process and a subsequent heat treatment for activating and diffusing the dopants, the stepped base region consisting of the inner portion 5 and the outer portion 5' is formed. Then, as is known from the above-mentioned EP-A-71 665, thermal oxidation is performed to form an oxide stripe 21 surrounding the emitter area 6, after which the remainders of the oxidation mask layer, particularly those of the portion 71, are removed.

The exposed areas 32 and 33 of the insulated-gate field-effect transistors can now be doped by ion implantation according to the desired threshold value and the desired type (enhancement type, depletion type), with the area 31 of the bipolar planar transistor remaining protected by an implantation mask, preferably of photoresist. FIG. 3 shows the condition prior to the surface implantation of dopants in the area 33 of the P-channel field-effect transistor. If suitable acceleration energies are chosen, dopants can also, of course, be implanted through the oxidation mask layer, but after careful removal of the remaining photoresist, the oxidation mask layer must be removed by etching, so that the semiconductor substrate will be exposed within the emitter area, leaving only the field-oxide layer 2 and the oxide stripe 21.

The main surface of the semiconductor substrate 1 is then covered with successive layers comprising of at least: an insulating top layer 10, preferably an oxide layer; and an underlying silicide layer 9, preferably of platinum silicide or cobalt silicide. To this end, a layer 8 of polycrystalline silicon is first deposited; it preferably has dopants of the conductivity type of the emitter region 4 when deposited, or is applied as a largely pure polycrystalline silicon layer and subsequently provided with these dopants, either from the gas phase or by ion implantation. This lower layer 8 is then covered with a silicide-forming metal layer, preferably of platinum or cobalt. According to the thickness of the metal layer 9, after suitable heating, successive layers are obtained which either include polycrystalline silicon layer 8 or in which this layer is no longer present as a result of the reaction of the metal with the silicon. FIG. 4 shows a structure with a lower polycrystalline silicon layer 8, an overlying metal structure 9, and a top layer 10.

To fabricate integrated field-effect transistors, the dopant of the lower silicon layer 8 must be chosen in accordance with the intended use of the electrodes, i.e., an n-type dopant for the area of the emitter region of the bipolar planar transistor, the areas of the source and drain regions of the N-channel field-effect transistor, and the area of the contact at the substrate region 3'. The lower polycrystalline layer 8 contains a p-type impurity only in the area of the substrate contact and in the areas of the source and drain regions of the p-channel field-effect transistor.

Since the remaining process step are equivalent to the steps necessary to fabricate the bipolar planar transistor, FIGS. 5–8 illustrate in enlarged scale only to the fabrication of the bipolar planar transistor by the method in accordance with the invention.

Starting from the structure shown in FIG. 4, which already includes the collector region 3 and the base region 5 with the outer portion 5' thereof, the oxide stripe 21 is divided into an inner portion 15 and an outer portion 16 using an anisotropic etching process, thus forming the moat 11 through the layers 8, 9, 10 as illustrated in FIG. 5. Anisotropic etching techniques are generally known in semiconductor technology and serve to produce vertical etch profiles, as is known from DE-A 32 43 059. To this end, a photoresist mask used as an etch mask is applied which leaves the area of the moat uncovered. Then, a plasma etching process is carried out in a reactor until the portion 18 of the semiconductor surface at the bottom of the moat is exposed around the portion 51 of the PN junction between the base region 5 and the collector region 3. Besides the emitter electrode, the collector electrode, which overlaps the field-oxide layer 2, is defined, as illustrated in FIG. 5.

Figure 6:
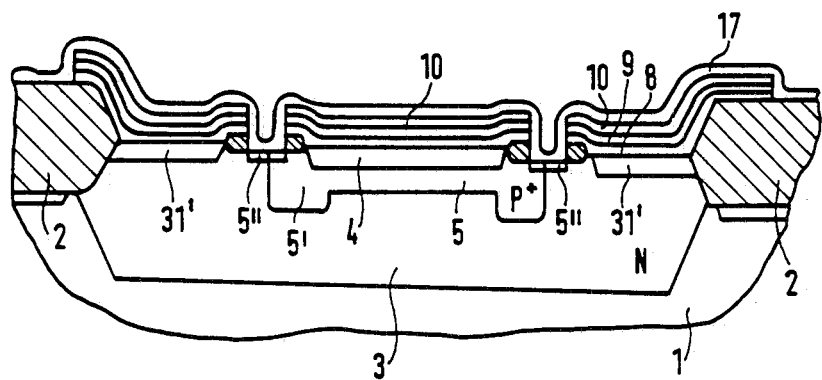
FIG. 6 is a cross-sectional view of the bipolar transistor of the substrate of FIG. 5 after formation of an emitter region and base contact areas.

Then, ions of the conductivity type of the base region 5 are implanted into the exposed semiconductor material at the bottom of the moat, with the successive layers 8, 9, 10 acting as a mask. This is followed by the deposition of an insulating layer 17 as shown in FIG. 6, which covers the surface of the moat 11, i.e., its bottom and side surfaces, and the remaining portions of the top layer 10.

Then, anisotropic etching is again performed from the gas phase in such a way that the rims of the moat 11, the rim of the emitter electrode 42, and the rim of collector electrode 32' remain covered by remainders of the deposited insulating layer, while the other portions of this isulating layer are removed down to the top layer 10.

Figure 7:
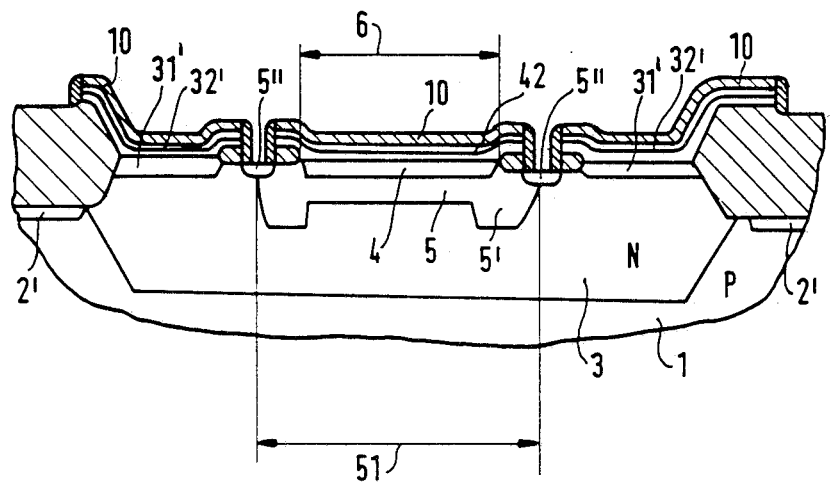
FIG. 7 is a cross-sectional view of the bipolar transistor of the substrate of FIG. 6 after exposure of the base contact areas.

Then, the structure is heated to sufficiently high temperatures to activate and diffuse the ions implanted into the bottom surface of the moat, which are of the conductivity type of the base region 5. This results in the base contact region 5", as illustrated in FIGS. 6 and 7. At this point, the purpose of the ions implanted into the bottom of the moat becomes apparent. Without this implantation, a superficial short circuit of the base-collector junction and poor contact to the base region would result during the subsequent deposition of the contact layer which is etched to define the base electrode, which overlaps the rims of the collector electrode 32' and the emitter electrode 42.

Figure 8:
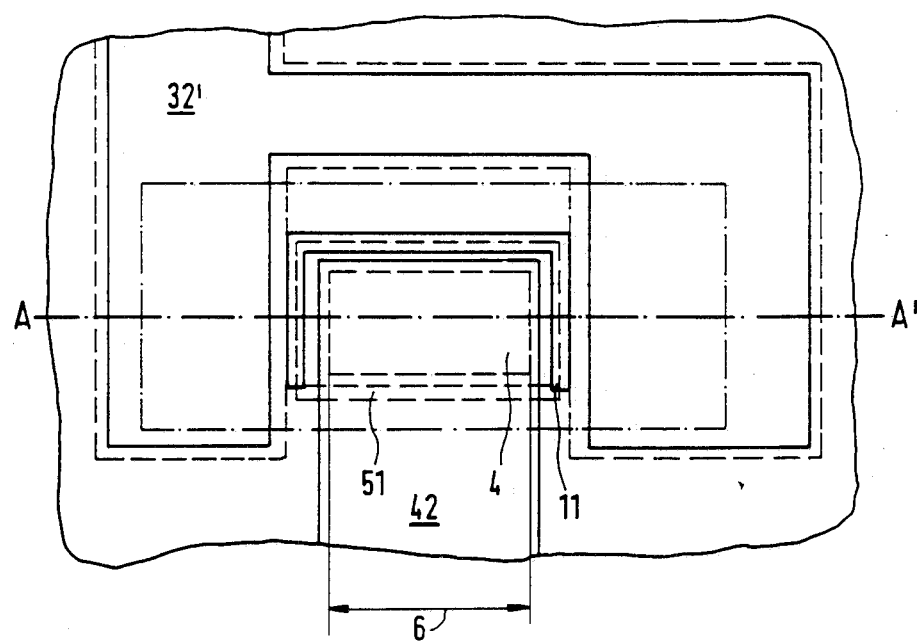
FIG. 8 is a plan top of the substrate of FIG. 7 which is seen through lines A—A of FIG. 8.

FIG. 8 is a top view of the structure of FIG. 7. FIG. 7 is a section taken along line A—A' of FIG. 8. In FIGS. 7 and 8, the base electrode is not shown, because its formation only requires that the base contact region 5" at the bottom of the moat 11 be contacted, while the remaining course of the conductive path connected to the base electrode is arbitrary. Both the emitter electrode 42 and the collector electrode 32' are covered by the insulating top layer 10, the rims of these electrodes 42 and 32' being protected by insulating layers, too. The regions of the integrated field-effect transistors diffuse out of the electrodes formed together with their conductive paths from the sucessive layers 8, 9, 10 during the moat-etching process described above.

Prior to the deposition of the successive layers 8, 9, 10, ions of the conductivity type of the emitter region 4 may be implanted into the exposed portions of the collector region and the emitter area 6. This has the advantage that the thickness of and the dopant concentration in the emitter region 4 can be set independent of the dopants in the polycrystalline silicon layer 8. If integrated circuits without P-channel field-effect transistors are fabricated, it suffices to deposit a uniform polycrystalline silicon layer containing only dopants of the conductivity type of the emitter region. It may be doped prior to its deposition or after its deposition, e.g., by ion implantation. The emitter region 4, the collector contact region 31' and the source and drain regions of the integrated N-channel field-effect transistor are then diffused out of the defined electrodes.

The method according to the invention has the advantage that all electrodes and interconnections either contain at least superficial silicide layers or are made from the metal of the base contact. An integrated circuit made by the method of the invention thus has substantially lower bulk resistances than a solid-state integrated circuit containing interconnections of polycrystalline silicon.

Many modifications and alterations may be made by those having ordinary skill in the art without departing from the spirit and scope of the invention. Therefore the illustrated embodiment must be understood as depicting the invention for the purposes of clarity and example and should not be read as limiting the invention which is defined in the following claims.

I claim:

1. An improvement in a method of making a monolithic integrated circuit, said circuit comprising a wafer-shaped semiconductor substrate, a field oxide layer disposed on said substrate, at least one bipolar planar transistor having a base, emitter and collector region, whose collector region, which lies at a main surface of said semiconductor substrate, forms a collector area at said surface within an opening defined in said field-oxide layer, wherein, to form said emitter retention and base region, said emitter region is covered with a portion of an oxidation mask layer of such a thickness that said oxidation mask layer is penetrated by dopants of said base region in a high-energy ion-implantation process and masked against dopants of said base region in a low-energy ion-implantation process, and after the ion-implantation processes, which are performed using an implantation mark defining said base region, the exposed semiconductor surface is thermally oxidized forming an oxide stripe surrounding the emitter region, whereafter said portion of said oxidation mask layer is removed, said improvement comprising the steps of:

providing said main surface of said semiconductor substrate with successive layers consisting of at least an insulating top layer and an underlying silicide layer after removal of said portion of said oxidation mask layer covering said emitter area;

dividing said oxide stripe into an inner portion and an outer portion using an anisotropic etch, thereby forming a moat through said successive layers, which comprise said top layer being a silicide layer, and a polycrystalline silicon layer;

exposing that portion of the PN junction between the outer portion of said base region and said collector region which extends to said semiconductor surface, so that in addition to an emitter electrode, a collector electrode is defined, which overlaps said field-oxide layer;

implanting ions of said conductivity type of said base region with said successive layers acting as a mask;

disposing an insulating layer which covers said surface of said moat and any remaining portion of said lop layer;

performing an anisotropic etch in gas phase, so that the rims of said moat, the rim of said emitter electrode, and the rim of said collector electrode remain covered by remainders of said insulating layer;

activating said implanted ions of said conductivity type of said base region by diffusion to form a base contact region; and disposing a contact layer for contacting said resulting base contact region from which said base electrode is formed using a photolithographic etching process.

2. The method of claim 1, wherein said polycrystalline silicon layer contains dopants of said conductivity type of said emitter region, and after said polycrystalline silicon layer is etched to define said emitter electrode and said collector electrode, said emitter region is diffused out of said emitter electrode, and at least one collector contact region is diffused out of said collector electrode.

3. The method of claim 1 wherein prior to said deposition of said successive layers, ions of said conductivity type of said emitter region are implanted into said exposed portions of said collector area and said emitter area.

4. An improvement in a method of fabricating an emitter area and collector area of a bipolar transistor, said emitter and collector being each covered with a portion of an oxidation mask layer, said improvement comprising the steps of:
- implanting ions of the conductivity type of said base region;
- forming an oxide stripe by thermal oxidation surrounding said emitter area;
- selectively removing portions of said oxidation mask layer;
- depositing successive layers comprising at least of a top layer and an underlying doped silicide layer;
- anisotropically etching through said oxide stripe used as a mask to form successive layers divided into an emitter electrode and a collector electrode; and
- diffusing said emitter region and said collector contact region from said emitter electrode and collector electrode respectively.

5. An improvement in a method of making a monolithic integrated circuit, said circuit formed in a wafer-shaped semiconductor substrate having a field-oxide layer disposed thereon and comprising at least one bipolar planar transistor having a collector, emitter and base region, said collector region lying at a main surface of said wafer-shaped semiconductor substrate and forming a collector area at said exposed surface within an opening of said field-oxide layer, wherein, to form said emitter region and said base region, said emitter area is covered with a portion of an oxidation mask layer of such a thickness that said oxidation mask layer is penetrated by dopants of said base region in a high-energy ion-implantation process and masked against dopants of said base region in a low-energy ion-implantation process, after said ion-implantation processes, which are carried out using an implantation mask defining said base area, said exposed semiconductor surface is thermally oxidized to form an oxide stripe surrounding said emitter area, whereafter said portion of said oxidation mask layer is removed, said improvement comprising the steps of:
- removing that portion of said oxidation mask layer covering said emitter area;
- providing said main surface of said semiconductor substrate with successive layers of at least an insulating top layer and an underlying silicide layer;
- dividing said oxide stripe into an inner portion and an outer portion using an anisotropic etching technique to form a moat through said successive layers, which comprise said top layer, and said silicide layer and to expose that portion of a PN junction between said outer base-region portion and said collector region which extends to said semiconductor surface, whereby in addition to said emitter electrode, said collector electrode is defined, which overlaps said field-oxide layer;
- implanting ions of said conductivity type of said base region with said successive layers acting as a mask;
- depositing an insulating layer to cover said surface of said moat and said remaining portions of said top layer;
- anisotropically etching in a gas phase, so that said rims of said moat, said rim of said emitter electrode, and said rim of said collector electrode remain covered by remainders of said insulating layer;
- activating said implanted ions of said conductivity type of said base region by diffusing said ions therein;
- depositing a contact layer of contacting said resulting base contact region; and
- forming said base electrode using a photolithographic etching process.

6. The improvement of claim 5 further comprising the steps of:
- depositing a polycrystalline silicon layer which contains dopants of the conductivity type of an emitter region, whose conductivity type is equivalent to that of a collector region;
- forming an emitter and collector electrode by etching said polycrystalline silicon layer;
- diffusing in said emitter region adjacent to said emitter electrode out of said emitter electrode;
- diffusing in an adjacent collector contact region out of said collector electrode.

7. The improvement of claim 5 further comprising the steps of:
- implanting ions of the conductivity type of the emitter region into the exposed portions of the collector area and the emitter area prior to disposing said successive layers which are etched to define the emitter electrode and the collector electrode, which exposed portions adjoin the emitter electrode and the collector electrode, respectively.

8. An improvement in a method of making a monolithic integrated circuit, said circuit formed in a wafer-shaped semiconductor substrate having a fieldoxide layer disposed thereon and comprising at least one active region, said exposed semiconductor surface being thermally oxidized to form an oxide layer within an active area, said improvement comprising the steps of:
- providing the surface of said semiconductor substrate with successive layers of at least an insulating top layer and an underlying silicide layer;
- dividing said oxide layer into an inner portion and an outer portion using an anisotropic etching technique to form a moat through said sucessive layers, which comprise said top player, and said silicide layer and to expose that portion of a junction defining the outer boundary of said active region, which junction extends to the semiconductor surface;
- implanting ions of said conductivity type of said active region with said successive layers acting as a mask;
- depositing an insulating layer to cover said surface of said moat and said remaining portions of said top layer;
- anistropically etching in a gas phase, so that said rims of said moat remains covered by remainders of said insulating layer;

activating said implanted ions of said conductivity type of said active region by diffusing said ions therein;

depositing a contact layer for contacting said resulting active contact region; and forming said active electrode using a photolithographic etching process.

* * * * *